(12) United States Patent
Matsushita et al.

(10) Patent No.: US 9,465,065 B2
(45) Date of Patent: Oct. 11, 2016

(54) LEAKAGE CURRENT CALCULATION DEVICE AND METHOD FOR CALCULATING LEAKAGE CURRENT

(71) Applicant: TANASHIN DENKI CO., LTD., Tokyo (JP)

(72) Inventors: Kenya Matsushita, Tokyo (JP); Masakatsu Sawada, Tokyo (JP)

(73) Assignee: TANASHIN DENKI CO., LTD., Tokyo (JP)

( * ) Notice: Subject to any disclaimer, the term of this patent is extended or adjusted under 35 U.S.C. 154(b) by 0 days.

(21) Appl. No.: 14/893,495

(22) PCT Filed: Apr. 16, 2014

(86) PCT No.: PCT/JP2014/002153
§ 371 (c)(1),
(2) Date: Nov. 23, 2015

(87) PCT Pub. No.: WO2014/192217
PCT Pub. Date: Dec. 4, 2014

(65) Prior Publication Data
US 2016/0124038 A1 May 5, 2016

(30) Foreign Application Priority Data

May 27, 2013 (JP) .................................. 2013-110968

(51) Int. Cl.
*G01R 31/14* (2006.01)
*G01R 31/08* (2006.01)
*H01H 31/12* (2006.01)
*G01R 31/02* (2006.01)

(52) U.S. Cl.
CPC .................................. *G01R 31/025* (2013.01)

(58) Field of Classification Search
CPC .................................................. G01R 31/025
USPC .................................. 324/509, 510, 525, 551
See application file for complete search history.

(56) References Cited

U.S. PATENT DOCUMENTS

2012/0025840 A1* 2/2012 Kim ..................... G01R 31/025
324/509

FOREIGN PATENT DOCUMENTS

| JP | H08285903 A | 11/1996 |
| JP | 2005207928 A | 8/2005 |

(Continued)

*Primary Examiner* — Vincent Q Nguyen
*Assistant Examiner* — Farhana Hoque
(74) *Attorney, Agent, or Firm* — Huffman Law Group, PC

(57) ABSTRACT

Provided is a leakage current calculation device capable of calculating an accurate leakage current value in which the effect of noise has been suppressed. The configuration comprises: a to-ground voltage measurement means for measuring, over a predetermined interval, to-ground voltages inputted in each phase of a three-phase motor; a zero-phase current measurement means for measuring, over a predetermined interval, a zero-phase current, which is the to-ground leakage current that flows through the three-phase motor; a basic AC voltage waveform extraction means for extracting, from the to-ground voltage, a basic AC voltage waveform having a frequency in the same phase as the to-ground voltage of each phase; a frequency component extraction means for extracting, in the frequency band containing the frequency of the basic AC voltage waveform, a zero-phase current component of said frequency band; and a leakage current value calculation means for calculating the leakage current value $I_0 \cos \theta$ flowing through the to-ground resistance component, excluding the to-ground capacitance component of the three-phase motor, among the to-ground leakage currents by integrating the zero-phase current components of the frequency band in an interval corresponding to gap between zero-crossings of the basic AC voltage waveform.

12 Claims, 11 Drawing Sheets

(56) References Cited

FOREIGN PATENT DOCUMENTS

| JP | 2007225625 A | 9/2007 |
| JP | 2009058234 A | 3/2009 |
| JP | 2009115754 A | 5/2009 |
| JP | 2010170902 A | 8/2010 |
| JP | 2011015583 A | 1/2011 |
| WO | WO2010100988 A1 | 9/2010 |

* cited by examiner (a)

(b)

LEAKAGE CURRENT CALCULATION DEVICE AND METHOD FOR CALCULATING LEAKAGE CURRENT

CROSS REFERENCE TO RELATED APPLICATIONS

The present application claims priority to International Application PCT/JP2014/002153, with an International Filing Date of Apr. 16, 2014, which claims the benefit of Japanese Patent Application No. 2013-110968 filed in the Japan Patent Office on May 27, 2013, the entire contents of which are incorporated herein by reference.

BACKGROUND OF THE INVENTION

1. Technical Field

The present invention relates to a leakage current calculation device and a method of calculating a leakage current, which calculate a leakage current flowing through the ground resistance component of a three-phase motor driven by an inverter device using a specific AC power supply as a power supply and, more particularly, to a leakage current calculation device and a method of calculating a leakage current, which calculate a leakage current based on each of ground voltages inputted to the respective phases of a three-phase motor.

2. Description of the Related Art

There has been known a leakage current calculation device for calculating the ground resistance component of a three-phase motor driven by an inverter device using a specific AC power supply as a power supply, that is, a leakage current flowing through an insulating resistor (e.g., Patent Document 1, 2).

In such a leakage current calculation device, the value of a leakage current may be calculated in a motor operation state.

PRIOR ART DOCUMENT

Patent Document

Patent Document 1: Japanese Patent Application Publication No. 2011-153910
Patent Document 2: Japanese Patent Application Publication No. 2009-115754

SUMMARY OF THE INVENTION

However, a conventional leakage current calculation device had the following problems.

For example, a leakage current calculation device written in Patent Document 1 is configured to calculate a leakage current by measuring the line voltage of a line connected to each of the phases of a three-phase motor. The reason why the leakage current is calculated based on the line voltage is for avoiding the complication and difficult calculation of a waveform in the overlapped combined voltage of a commercial AC power supply voltage and a ground voltage, that is, a line voltage. However, there is a possibility that calculating the leakage current based on the line voltage may be inaccurate because the leakage current varies depending on such a ground voltage, that is, a combined voltage.

Meanwhile, a leakage current calculation device written in Patent Document 2 is configured to calculate a leakage current based on a ground voltage inputted to each of the phases of a three-phase motor, but is configured to calculate a leakage current based on a ground voltage having a maximum value. However, a maximum value of the ground voltage may not be necessarily defined as a maximum value at a steady operation, and it may not be said that a leakage current can be precisely calculated because noise of harmonic may have overlapped the leakage current.

Furthermore, in order to precisely calculate the degree that the insulation degradation state of each of the phases of the three-phase motor is in progress, the resistance value (insulating resistance value) of the ground resistance component of each of the phases of the three-phase motor needs to be calculated. However, a conventional leakage current calculation device was unable to calculate the insulating resistance value of each of the phases of the three-phase motor.

The present invention has been made to solve such problems, and an object of the present invention is to provide a leakage current calculation device and a method of calculating a leakage current, which measures the overlapped ground voltage of each phase control voltage fed (supplied) from an inverter device to a three-phase motor and a commercial AC power supply voltage and can calculate the insulating resistance value of each of the phases of the three-phase motor in addition to an accurate leakage current value.

In order to accomplish the object, a leakage current calculation device of the present invention ground includes voltage measurement means for measuring ground voltages respectively inputted to the phases of a three-phase motor driven by an inverter device using a specific AC power supply as a power supply in a specific period, zero-phase current measurement means for measuring a zero-phase current which is a ground leakage current flowing through the three-phase motor in a specific period, basic AC waveform extraction means for extracting a basic AC voltage waveform having a frequency having the same phase as the ground voltage of each phase from the ground voltage, frequency component extraction means for extracting the zero-phase current component of a frequency band including at least the frequency of the basic AC voltage waveform from the frequency band, and leakage current value calculation means for calculating a leakage current value flowing through the ground resistance component of the ground leakage current other than the ground capacitance component of the three-phase motor by integrating the zero-phase current component of the frequency band in a period corresponding between zero crossings of the basic AC voltage waveform.

Furthermore, a method of calculating a leakage current according to the present invention includes a ground voltage measurement process for measuring ground voltages respectively inputted to the phases of a three-phase motor driven by an inverter device using a specific AC power supply as a power supply in a specific period, a zero-phase current measurement process for measuring a zero-phase current which a ground leakage current flowing through the three-phase motor in a specific period, a basic AC waveform extraction process for extracting a basic AC voltage waveform having a frequency having the same phase as the ground voltage of each phase from the ground voltage, a frequency component extraction process for extracting the zero-phase current component of a frequency band comprising at least the frequency of the basic AC voltage waveform from the frequency band, and a leakage current value calculation process for calculating a leakage current value flowing through the ground resistance component of the ground leakage current other than the ground capacitance component of the three-phase motor by integrating the zero-phase current component in a period corresponding between zero crossings of the basic AC voltage waveform.

In accordance with the leakage current calculation device and the method of calculating a leakage current of the present invention, an accurate leakage current value on which the influence of noise has been suppressed can be calculated because a leakage current value flowing through the ground resistance component of a ground leakage current other than the ground capacitance component of a three-phase motor is calculated by integral calculus.

DETAILED DESCRIPTION

Hereinafter, preferred embodiments of a leakage current calculation device and a method of calculating a leakage current regarding the present invention are described with reference to FIGS. 1~11.

Figure 1:
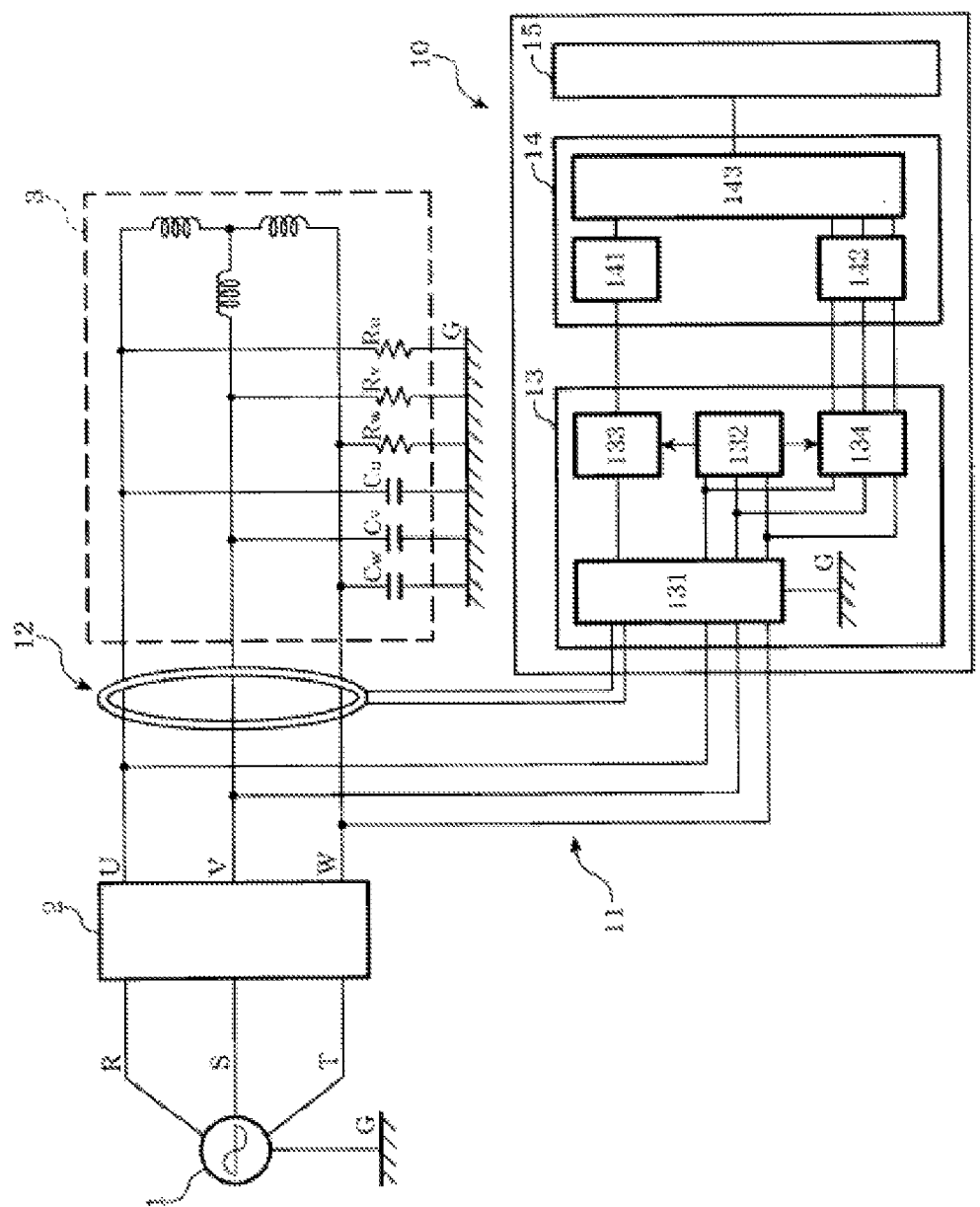
FIG. 1 is a diagram showing the configuration of a leakage current calculation device and a method of calculating a leakage current regarding a first embodiment of the present invention.
Figure 2:
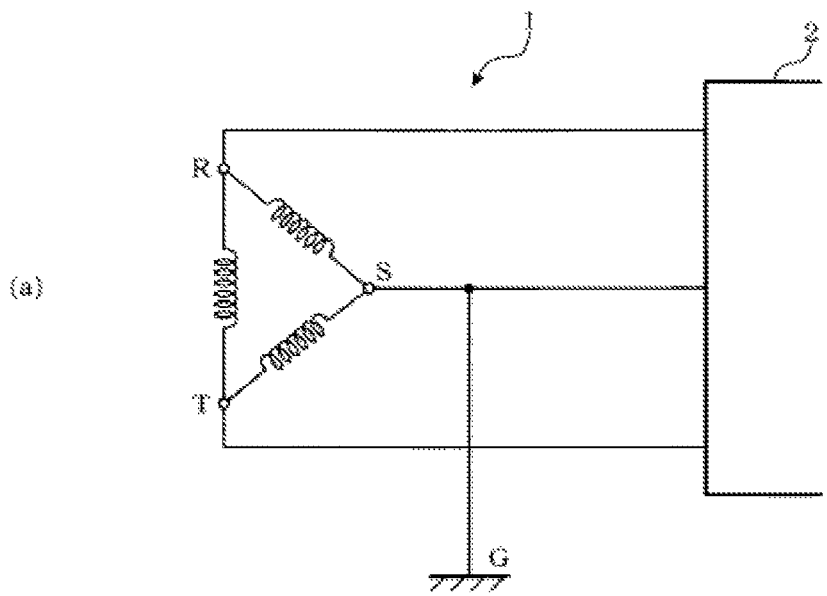
FIG. 2 is a diagram showing a power distribution form of a commercial AC power supply voltage supplied to an inverter device, (a) is a diagram showing a three-phase delta wiring method, and (b) is a diagram showing a three-phase start wiring method.
Figure 2:
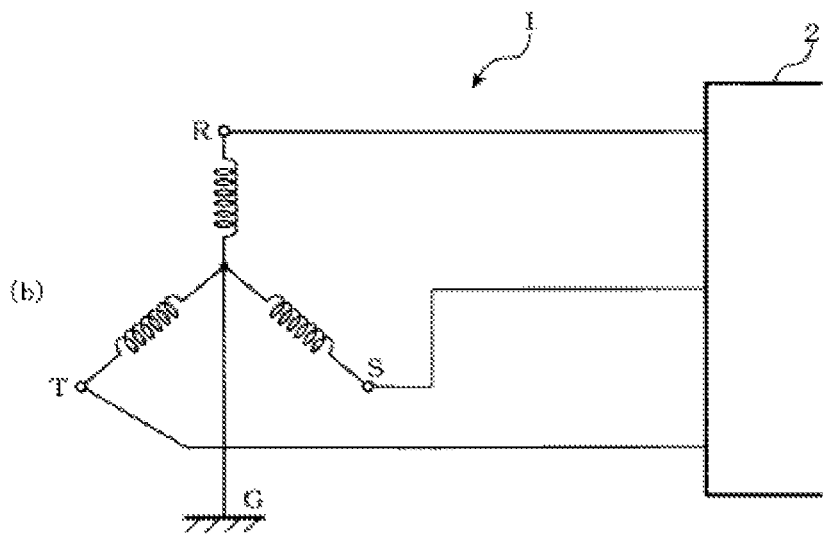
Figure 3:
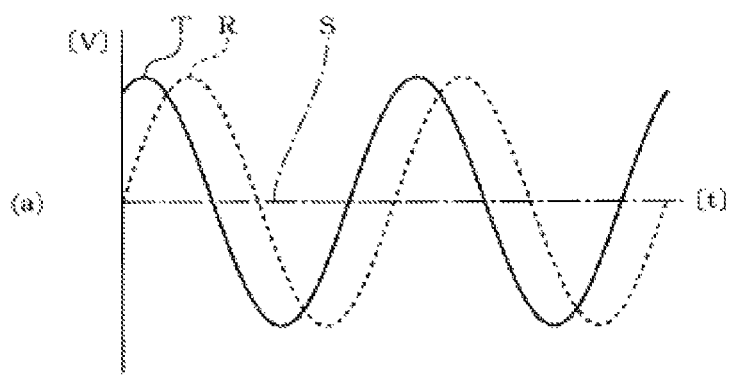
FIG. 3 is a diagram showing the voltage waveforms of the three-phase delta wiring method, (a) is a diagram of commercial voltage waveforms inputted to the inverter device, and (b) is a diagram of a rectified commercial voltage waveform (basic AC voltage waveform) in the inverter device.
Figure 3:
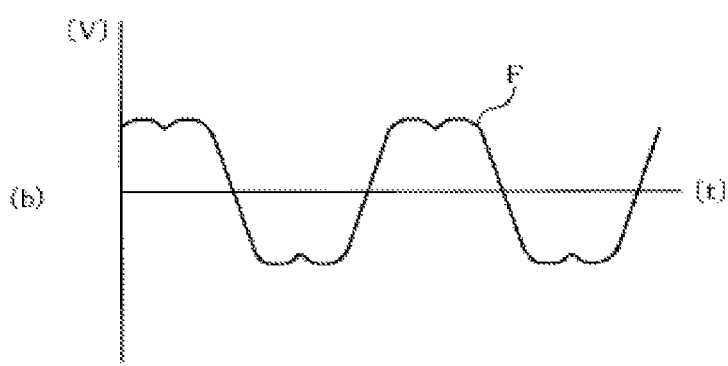
Figure 4:
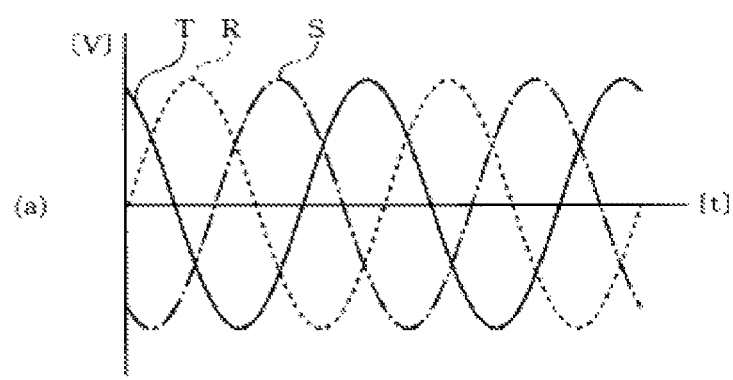
FIG. 4 is a diagram showing the voltage waveforms of the three-phase start wiring method, (a) is a diagram of commercial voltage waveforms inputted to the inverter device, and (b) is a diagram of a rectified commercial voltage waveform (basic AC voltage waveform) in the inverter device.
Figure 4:
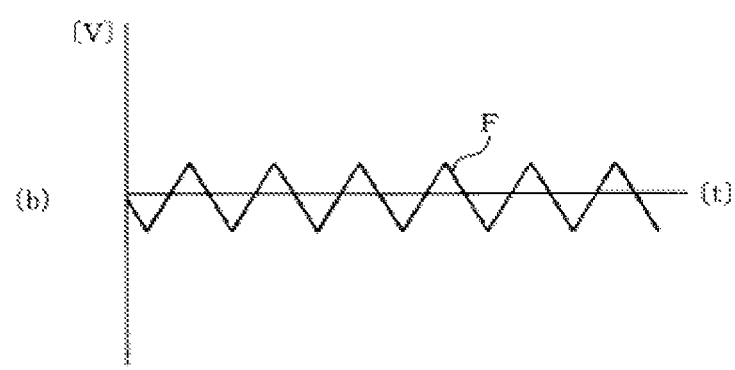
Figure 5:
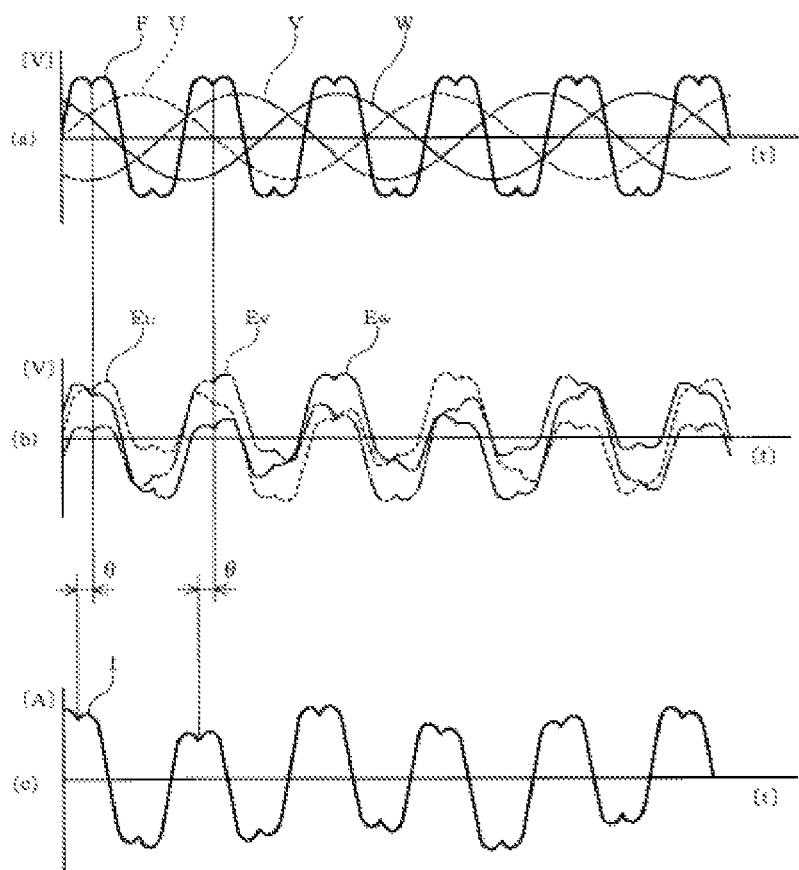
FIG. 5 is a diagram showing the waveforms of the three-phase delta wiring method, (a) is a diagram of a basic AC voltage waveform and control voltage waveforms controlling the respective phases of a three-phase motor, (b) is a diagram of the overlapped control voltage waveforms of the basic AC voltage waveform, and (c) is a diagram of a zero-phase current waveform.
Figure 6:
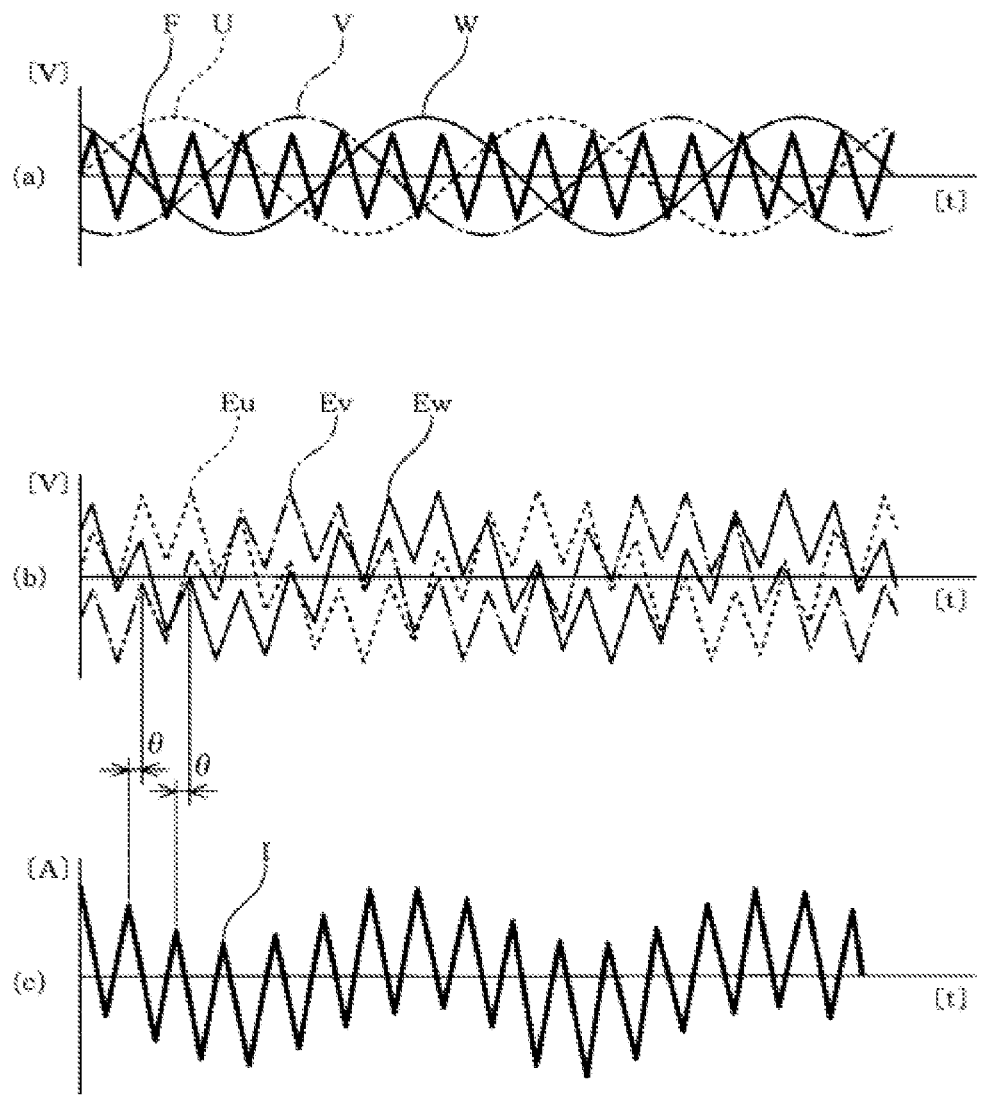
FIG. 6 is a diagram showing the waveforms of the three-phase start wiring method, (a) is a diagram of a basic AC voltage waveform and control voltage waveforms controlling the respective phases of the three-phase motor, (b) is a diagram of overlapped control voltage waveforms of the basic AC voltage waveform, and (c) is a diagram of a zero-phase current waveform.

As shown in FIG. 1, the leakage current calculation device 10 regarding the present embodiment is configured to measure a leakage current flowing through the ground resistance component of a three-phase motor 3, such as a servo motor driven by an inverter device 2 using a commercial AC power supply 1 as a power supply.

The leakage current calculation device 10 is equipped with three phase voltage measurement cables 11, a zero-phase current transformer (ZCT) 12, a signal processing unit 13, an operation unit 14, and a display unit 15 (e.g., a liquid crystal display) displaying a result of operation of the operation unit 14.

The three phase voltage measurement cables 11 operate as ground voltage measurement means and are connected to the respective phases U, V, and W of the three-phase motor 3. The three phase voltage measurement cables 11 measure the respective phase ground voltages of control voltages, inputted from the inverter device 2 to the respective phases U, V, and W of the three-phase motor 3, in a specific sampling period of a specific period.

The respective phase ground voltages are indicative of potential differences between the phases U, V, and W and a ground G and are measured as the overlapped values of the commercial AC power supply 1 and control voltages (e.g., a combined voltage of a basic wave and a carrier wave according to PWM control).

The zero-phase current transformer (ZCT) 12 operates as zero-phase current measurement means and measures the combined ground zero-phase current of the three phases flowing between the inverter device 2 and the three-phase motor 3 in a specific sampling period of a specific period.

The ground zero-phase current is measured as a combined value of leakage currents, flowing from the respective phases of the three-phase motor 3 to the ground G, based on the ground electrostatic capacitance components Cu, Cv, and Cw of the respective phases of the three-phase motor 3 and ground resistance components Ru, Rv, and Rw that become insulating resistance.

The signal processing unit 13 processes the ground voltages and ground zero-phase current of the phases U, V, and W received from the three phase voltage measurement cables 11 and the zero-phase current transformer (ZCT) 12.

Specifically, the signal processing unit 13 includes a frequency component extraction unit 131, a basic AC waveform extraction unit 132, and zero-crossing data extraction units 133 and 134.

The frequency component extraction unit 131 operates as frequency component extraction means and extracts the respective phase ground voltages of frequency components in the same frequency band and a ground zero-phase current, which are measured by the three phase voltage measurement cables 11 and the zero-phase current transformer (ZCT) 12.

The frequency component extraction unit 131 is formed of a frequency filter, such as a low pass filter or a band pass filter, and extracts the frequency components of respective phase ground voltages and a ground zero-phase current in a specific frequency band.

In this case, the frequency band of the frequency component extracted by the frequency component extraction unit 131 is described below.

The frequency band of the frequency component extracted by the frequency component extraction unit 131 is set to include the frequency of the commercial AC power supply 1 or a frequency that is a positive number times the frequency of the commercial AC power supply 1.

For example, in a commercial AC power supply 1 having a power distribution form of a three-phase delta wiring method in which an S phase has been ground as shown in FIG. 2(a), the waveforms of the ground voltages of the R phase and T phase of three phases become sine waves having a deviation of 60° between their phases as shown in FIG. 3(a).

The inverter device 2 rectifies an input sine wave through a diode and a smoothing condenser. A ground voltages obtained as a result of the rectification becomes a voltage waveform F having the same frequency component as the commercial AC power supply 1, as shown in FIG. 3(b).

The frequency of the voltage waveform F becomes 50 Hz if the frequency of the commercial AC power supply 1 is 50 Hz and becomes 60 Hz if the frequency of the commercial AC power supply 1 is 60 Hz.

Likewise, in a commercial AC power supply 1 having a power distribution form of a three-phase start wiring method shown in FIG. 2(b), the waveforms of the ground voltages of the respective three phases R, S, and T become sine waves having a deviation of 60° between their phases as shown in FIG. 4(a).

The inverter device 2 rectifies an input sine wave through the diode and the smoothing condenser. A ground voltage obtained as a result of the rectification becomes a voltage waveform F having a frequency component three times the frequency component of the commercial AC power supply 1 as shown in FIG. 4(b).

The frequency of the voltage waveform F becomes 150 Hz if the frequency of the commercial AC power supply 1 is 50 Hz and becomes 180 Hz if the frequency of the commercial AC power supply 1 is 60 Hz.

The frequency component of such a voltage waveform F overlaps the waveforms of respective phase ground voltages and a ground zero-phase current.

The control voltages inputted to the phases U, V, and W of the three-phase motor 3 may be indicated as sine waves having a deviation of 60° between their phases (refer to FIGS. 5(a) and 6(a)). The frequency of the control voltage (the basic wave of the control voltage) is not limited to be the same as the frequency of the voltage waveform F.

In the respective phase ground voltages, the voltage waveform F overlaps such a control voltage. For example, in the commercial AC power supply 1 having the power distribution form of the three-phase delta wiring method, the respective phase ground voltages Eu, Ev, and Ew of the three-phase motor 3 appear as waveforms, such as those shown in FIG. 5(b).

Likewise, in the commercial AC power supply 1 having the power distribution form of the three-phase start wiring method, the respective phase ground voltages Eu, Ev, and Ew of the three-phase motor 3 appear as waveforms, such as those shown in FIG. 6(b).

That is, each of the respective phase ground voltages Eu, Ev, and Ew of the three-phase motor 3 includes the frequency component of the voltage waveform F as the in-phase frequency component despite a difference between power distribution forms.

Meanwhile, the frequency component of the voltage waveform F also overlaps the waveform of a ground zero-phase current I (refer to FIGS. 5(c) and 6(c)) because the ground zero-phase current I flows into the ground G through each of the ground electrostatic capacitance components Cu, Cv, and Cw and the ground resistance components Ru, Rv, and Rw (refer to FIG. 1) based on each of the potential differences of the overlapped respective phase ground voltages Eu, Ev, and Ew of such voltage waveforms F.

Furthermore, it has been known that the waveform of the ground zero-phase current I has a phase of an angle of e with respect to the waveform of the respective phase ground voltages Eu, Ev, and Ew under the influence of the ground electrostatic capacitance components Cu, Cv, and Cw.

A pair of a voltage waveform and a current waveform complying with Ohm's Law can be specified by extracting the voltage waveform and the current waveform having the same frequency band because the ground zero-phase current I is obtained based on the overlapped respective phase ground voltages Eu, Ev, and Ew of the voltage waveform F as described above. Furthermore, the frequency component of the voltage waveform F is a frequency component that is common to the respective phase ground voltages Eu, Ev, and Ew of the respective three phases and the ground zero-phase current I.

Accordingly, the frequency component extraction unit 131 sets an extraction frequency band with respect to a frequency band including at least the frequency of the voltage waveform F and extracts the ground zero-phase current I and the frequency components of the respective phase ground voltages Eu, Ev, and Ew from the extraction frequency band.

In order to set the extraction frequency band, the frequency of the voltage waveform F needs to be specified.

The voltage waveform F overlapping the respective phase ground voltages Eu, Ev, and Ew of the three-phase motor 3 also includes a harmonic component that is a positive number times a commercial frequency in addition to a frequency one times the commercial frequency in the commercial AC power supply 1 having the power distribution form of the three-phase delta wiring method and a harmonic component that is a positive number times a commercial frequency in addition to a frequency three times the commercial frequency in the commercial AC power supply 1 having the power distribution form of the three-phase start wiring method. However, it is difficult to extract a frequency band that much because amplitude tends to be reduced as the frequency band becomes harmonic. Accordingly, a frequency band may be set so that it includes a voltage waveform F having the frequency component of a low frequency having the greatest amplitude.

Specifically, in the commercial AC power supply 1 having the power distribution form of the three-phase delta wiring method, if a commercial frequency is 50 Hz, for example, an extraction frequency band may be set using 50 Hz, having the same frequency as the commercial frequency, as the frequency of a basic AC voltage waveform. In the commercial AC power supply 1 having the power distribution form of the three-phase start wiring method, if a commercial frequency is 50 Hz, for example, an extraction frequency band may be set using 150 Hz that becomes harmonic three times the commercial frequency of 50 Hz as a basic AC voltage waveform.

Furthermore, the set extraction frequency band may have a band (e.g., the band of a pin point or a narrow band) having approximately the same frequency as the basic AC voltage waveform so that only the basic AC voltage waveform can be extracted.

Furthermore, the extraction frequency band may have a specific numerical range, such as the frequency ±α (e.g., +100 Hz, −20 Hz) of the basic AC voltage waveform so that the component (e.g., PWM-controlled component) of a control voltage overlapping the basic AC voltage waveform can be extracted. In particular, as described later, in order to calculate the resistance value of each of the ground resistance components Ru, Rv, and Rw, the extraction frequency band needs to include the frequency of a basic AC voltage waveform and to have a specific numerical range in which the component of a control voltage can be extracted.

The basic AC waveform extraction unit 132 operates as basic AC waveform extraction means and extracts a basic AC voltage waveform from the respective phase ground voltages Eu, Ev, and Ew from the three-phase motor 3.

As shown in FIGS. 5(a) and 6(a), control voltages respectively inputted to the phases U, V, and W of the three-phase motor 3 may be indicated as sine waves having a deviation of 60° between their phases. The control voltages of the respective phases are characterized in that they become a value of ⌈zero⌋ if they are added in a specific moment.

Accordingly, the basic AC waveform extraction unit 132 adds the values of the respective phase ground voltages Eu, Ev, and Ew in the same measurement timing and extracts a basic AC voltage waveform (basic AC voltage Ef) by subtracting ⌈3⌋ of the three phases from the sum.

Furthermore, in the frequency component extraction unit 131, the frequency component extraction unit 131 may operate as basic AC waveform extraction means by setting an extraction frequency band as only the frequency of a basic AC voltage waveform (e.g., a band pass filter for extracting only the frequency of a basic AC voltage waveform).

The zero-crossing data extraction units 133 and 134 specify a plurality of zero crossings of a basic AC voltage waveform extracted by the basic AC waveform extraction unit 132 and simultaneously specify the respective phase ground voltages Eu, Ev, and Ew in a section corresponding between zero-crossings and the numerical data (measured values) of the ground zero-phase current I as a pair of data groups. Furthermore, the zero-crossing refers to a portion in which amplitude is indicative of zero (0) in the waveform of a basic AC voltage Ef having both symmetry and periodicity in amplitude.

By the specification of such zero-crossings, the waveforms of the respective phase ground voltages Eu, Ev, and Ew complying with Ohm's Law and the waveform of the ground zero-phase current I forming pairs along with the waveforms of the respective phase ground voltages Eu, Ev, and Ew are specified between the zero-crossings.

Furthermore, the zero-crossing data extraction unit 134 specifies the numerical data (measured values) of the basic AC voltage Ef in the period corresponding between the zero-crossings as a data group in which the respective phase ground voltages Eu, Ev, and Ew and the ground zero-phase current I form pairs in the basic AC voltage waveform extracted by the basic AC waveform extraction unit 132.

The operation unit 14 is formed of a computer including a central processing unit (CPU), ROM, RAM, and an interface, such as I/O, and includes a current value calculation unit 141, a voltage value calculation unit 142, and a resistance value calculation unit 143.

The current value calculation unit 141 operates as leakage current calculation means. The current value calculation unit 141 integrates the numerical data of the ground zero-phase current I between a plurality of zero-crossings ZC0, ZC1, ZC2 and also calculates average current values between the zero-crossings ZC0, ZC1, ZC2 . . . based on the integral values.

The voltage value calculation unit 142 operates as basic AC voltage value calculation means and respective phase voltage value calculation means. The voltage value calculation unit 142 integrates the numerical data of the basic AC voltage Ef and the respective phase ground voltages Eu, Ev, and Ew between the plurality of zero-crossings ZC0, ZC1, ZC2 . . . and also calculates average voltage values between the zero-crossings based on the integral values.

The resistance value calculation unit 143 operates as combined resistance value calculation means and respective phase resistance value calculation means. The resistance value calculation unit 143 calculates a combined ground combined resistance value of each of the ground resistance components Ru, Rv, and Rw of the respective phases and each of the resistance values of the ground resistance components Ru, Rv, and Rw of the respective phases based on the average current values of the ground zero-phase current I calculated based on measurement data between the same zero-crossings in the current value calculation unit 141 and the voltage value calculation unit 142, the basic AC voltage Ef forming pairs along with the average current values, and the average voltage values of the respective phase ground voltages Eu, Ev, and Ew.

Figure 8:
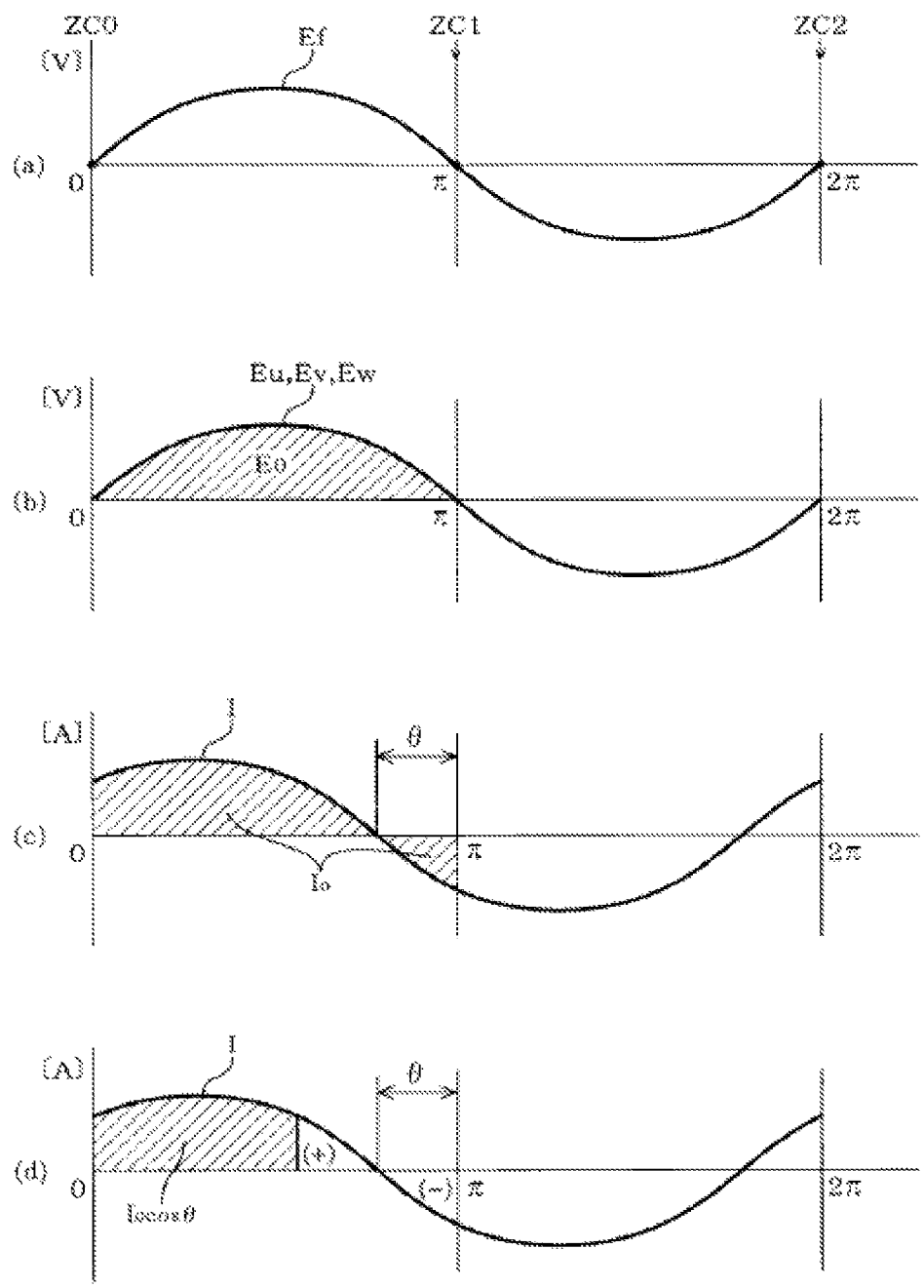
FIG. 8 is a diagram showing the relationships between the phases of a voltage waveform and a current waveform, (a) is a diagram of a basic AC voltage waveform, (b) is a diagram of the overlapped control voltage waveform of the basic AC voltage waveform, (c) is a diagram of a zero-phase current waveform, and (d) is a diagram showing the current value of the resistance component of the zero-phase current as an area.
Figure 9:
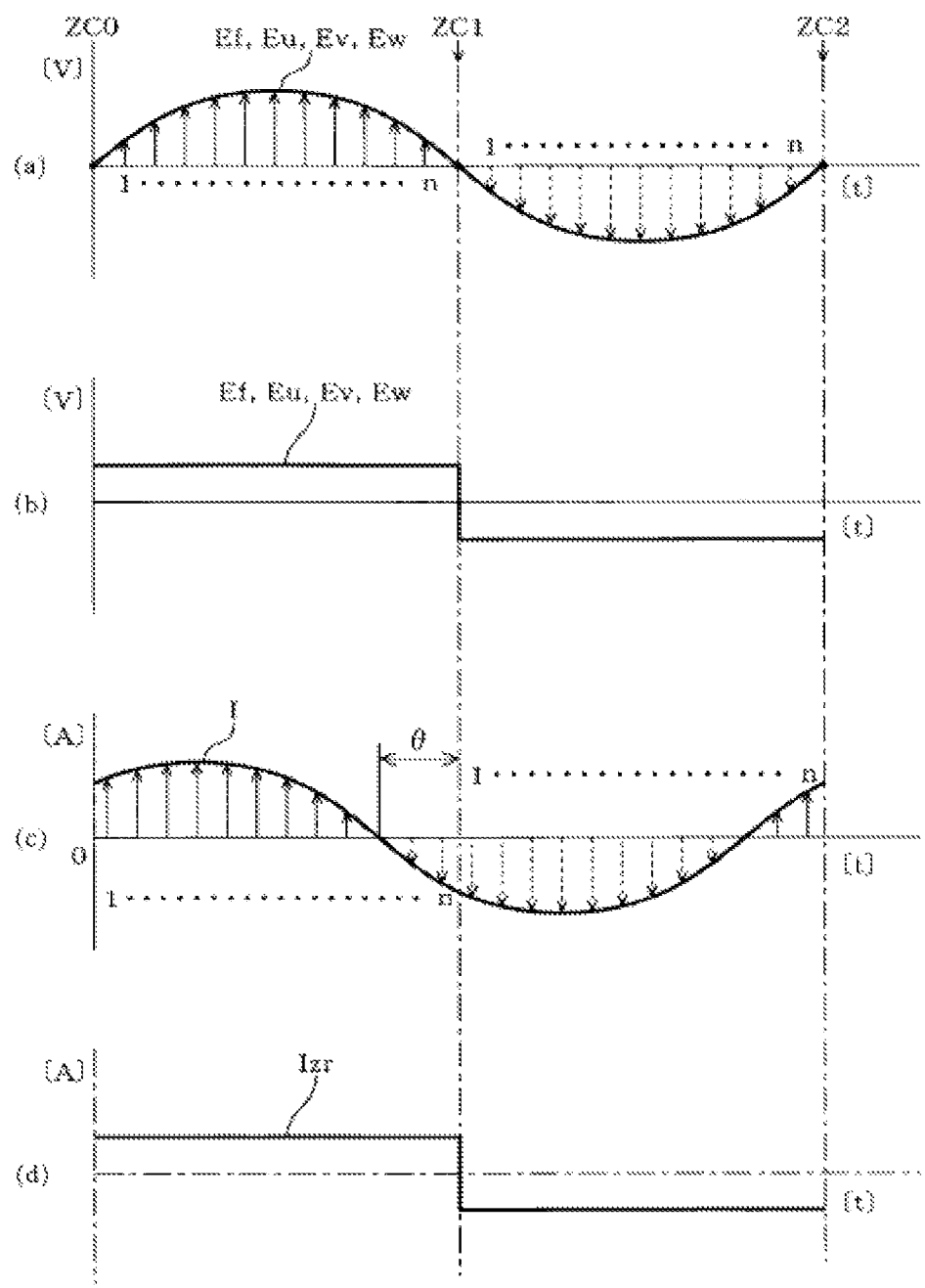
FIG. 9 is an explanatory diagram illustrating a method of calculating a voltage value and a current value, (a) is a diagram showing a method of calculating a basic AC voltage value and the voltage values of the respective phases, (b) is a diagram showing a basic AC voltage value and an average value of the voltage values of the respective phases, (c) is a diagram showing a method of calculating the current value of the resistance component of a zero-phase current, and (d) is a diagram showing an average value of the current value of the resistance component of the zero-phase current.

First, the principle that a leakage current flowing through a ground resistance component that belongs to the ground zero-phase current I and that is calculated by the current value calculation unit 141 is calculated is described with reference to FIGS. 7~9.

FIG. 8(a) shows the waveform of a basic AC voltage Ef, FIG. 8(b) shows the waveform of the basic AC voltage Ef and the waveform of the respective phase ground voltages Eu, Ev, and Ew obtained by combining the waveforms of control voltages, and FIG. 8(c) shows the waveform of a ground zero-phase current I. In order to simplify a description, each of the waveforms is diagrammatically shown as a simple sine wave.

The basic AC voltage Ef shown in FIG. 8(a) has been extracted by the basic AC waveform extraction unit 132. In this basic AC voltage Ef, a zero-crossing ZC whose amplitude becomes zero (0) is sequentially specified as ZC0, ZC1, ZC2 . . . from the basic AC waveform.

The respective phase ground voltages Eu, Ev, and Ew shown in FIG. 8(b) are voltages extracted by the frequency component extraction unit 131 as the frequency component of a frequency band including the frequency of the basic AC voltage Ef. The respective phase ground voltages Eu, Ev, and Ew have a waveform having the same phase as the waveform of the basic AC voltage Ef. Furthermore, the numerical data (measured values) of the respective phase ground voltages Eu, Ev, and Ew belonging between the zero-crossings ZC0, ZC1, ZC2 . . . is determined by specifying the zero-crossings.

The ground zero-phase current I shown in FIG. 8(c) is a current extracted by the frequency component extraction unit 131 as the frequency component of a frequency band including the frequency of the basic AC voltage Ef. Furthermore, the numerical data (measured values) of the ground zero-phase currents I belonging between the zero-crossings ZC0, ZC1, ZC2 . . . is determined by specifying the zero-crossings.

The ground zero-phase current I between the zero-crossings flows based on the respective phase ground voltages Eu, Ev, and Ew between the zero-crossings which form pairs along with the ground zero-phase current. For example, the ground zero-phase current I between ZC0 and ZC1 flows based on the respective phase ground voltages Eu, Ev, and Ew between ZC0 and ZC1.

In other words, as shown in FIGS. 8(b) and 8(c), the current of a value $I_0$ (the area of a hatching section) obtained by integrating the ground zero-phase current I between the zero-crossings flows based on the voltage of a value $E_0$ (the area of a hatching section) obtained by integrating the respective phase ground voltages Eu, Ev, and Ew between the zero-crossings.

However, the ground zero-phase current I also includes a leakage current (capacitance component current) flowing through the ground electrostatic capacitance components Cu, Cv, and Cw in addition to a leakage current (resistance component current) flowing through the ground resistance components Ru, Rv, and Rw.

Figure 7:
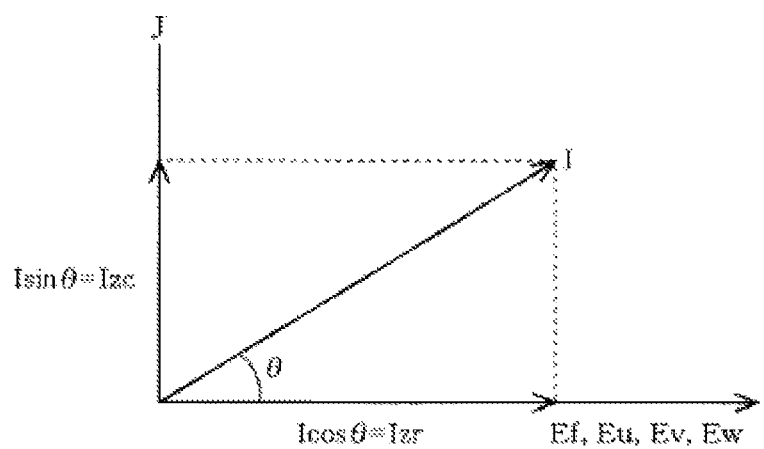
FIG. 7 is a diagram showing the relationship between a zero-phase current, the resistance component of the zero-phase current, and the capacitance component of the zero-phase current.

If the ground zero-phase current I, the resistance component current of the ground zero-phase current I, and the capacitance component current of the ground zero-phase current I are represented as respective vectors, they have a relationship, such as that shown in FIG. 7.

It has been known that the resistance component current of the ground zero-phase current I does not have a deviation of a phase for the basic AC voltage Ef and the respective phase ground voltages Eu, Ev, and Ew, but the capacitance component current of the ground zero-phase current I has a phase of 90° with respect to the basic AC voltage Ef and the respective phase ground voltages Eu, Ev, and Ew.

The phase of the ground zero-phase current I slips at a specific angle θ with respect to the basic AC voltage Ef and the respective phase ground voltages Eu, Ev, and Ew due to the influence of the deviation of a phase attributable to such a capacitance component.

Accordingly, if the amount of the ground zero-phase current I is represented as $I_0$, the resistance component current of the ground zero-phase current I may be represented as $I_0 \cos θ$.

As shown below, the resistance component current $I_0 \cos θ$ is the same as a value obtained by integrating the waveform of the ground zero-phase current I between the zero-crossings.

For example, if the ground zero-phase current I is the sine wave of amplitude 1, it may be represented as in Equation 1.

[Equation 1]

$$I(t)=\sin(ωt+θ) \qquad \text{(Equation 1)}$$

In this case, t is time, ω=2πf, f is the frequency of the ground zero-phase current I, and θ is a deviation of the phase of the ground zero-phase current I for the basic AC voltage Ef and the respective phase ground voltages Eu, Ev, and Ew.

If a total area of the ground zero-phase current I between the zero-crossings is $I_0$, $I_0$ may be calculated as in Equation 2.

[Equation 2]

$$I_0=\int_0^π|I(t)|dt=\int_0^π|\sin(ωt+θ)|dt=\int_0^π\sin ωt\,dt=2 \qquad \text{(Equation 2)}$$

Meanwhile, if I(t) is integrated between the zero-crossings, it is represented as in Equation 3.

[Equation 3]

$$\int_0^π I(t)dt=\int_0^π \sin(t+)dt=2\cos θ=I_0 \cos θ \qquad \text{(Equation 3)}$$

That is, the resistance component current $I_0 \cos θ$ of the ground zero-phase current I, that is, the combined value of a leakage current flowing through the components Ru, Rv, and Rw of a resistance value, may be calculated by integrating the ground zero-phase current I between the zero-crossings.

The reason why the resistance component current (leakage current) of the ground zero-phase current I may be calculated by integrating the ground zero-phase current I between the zero-crossings as described above is that a capacitance component current flowing as an invalid component with respect to the basic AC voltage Ef and the respective phase ground voltages Eu, Ev, and Ew becomes ⌈zero⌋ because the (−) part and (+) part of the capacitance component current are offset in a single zero-crossing, that is, in the half cycles of the waveforms of the respective phase ground voltages Eu, Ev, and Ew, and only the resistance component current $I_0 \cos θ$ (the area of the hatching part) that becomes a valid component in which a deviation of a phase is not generated with respect to the basic AC voltage Ef and the respective phase ground voltages Eu, Ev, and Ew remains, as shown in FIG. 8(d).

As described above, the resistance component current $I_0 \cos θ$ of the ground zero-phase current I may be calculated by integrating the ground zero-phase current I between the zero-crossings.

A detailed method of calculating the resistance component current $I_0 \cos θ$ (resistance component leakage current) which is executed in the current value calculation unit 141 is described using FIGS. 9(c) and 9(d).

[Method of Calculating Resistance Component Current $I_0 \cos θ$]

As shown in FIG. 9(c), since the ground zero-phase current I is measured in a specific period in a specific sampling period, the numerical data (measured values) of the ground zero-phase current I extracted by the zero-crossing data extraction unit 133 is assumed to be n, for example, between the zero-crossings.

In order to calculate the resistance component current $I_0 \cos θ$, the current value calculation unit 141 attaches a + or − sign to each of the 1 to n ground zero-phase currents I depending on a difference (e.g., ±) between the directions in which currents flow (in FIG. 9(c), a solid line arrow is + and a broken line arrow is −) and sequentially adds them.

Since the addition is equivalent to the integration of the ground zero-phase currents I between the zero-crossings, the added current value becomes the current value of the resistance component current $I_0 \cos θ$ of the ground zero-phase current I.

Furthermore, the resistance component current $I_0 \cos θ$ calculated as described above may include the component of a control voltage (e.g., a PWM-controlled component) and may include only the frequency of a basic AC voltage waveform component by excluding the component of a control voltage from the resistance component current $I_0 \cos θ$.

This may be selected by increasing or decreasing the numerical range of an extraction frequency band set by the frequency component extraction unit 131.

For example, if an extraction frequency band set by the frequency component extraction unit 131 is set as the band of a frequency that is approximately the same as the frequency of a basic AC voltage waveform component, the resistance component current $I_0 \cos\theta$ has a value only including the frequency of the basic AC voltage waveform component.

Furthermore, the resistance component current $I_0 \cos\theta$ has a combined value of the frequency of a basic AC voltage waveform component and the component of a control voltage (e.g., a PWM-controlled component) by setting a set extraction frequency band as a frequency band having a specific numerical range, such as the frequency ±α (e.g., +100 Hz, −20 Hz) of the basic AC voltage waveform.

[Method of Calculating Average Resistance Component Current Izr]

Furthermore, as shown in FIG. 9(d), an average resistance component current Izr, that is, an average value of the resistance component current $I_0 \cos\theta$ between the zero-crossings, may be calculated.

The current value calculation unit 141 calculates an average resistance component current Izr by dividing an added current value (the resistance component current $I_0 \cos\theta$) by n.

Furthermore, the sampling cycle of the ground zero-phase current I may be set in a specific cycle, and the accuracy of the values of the resistance component current $I_0 \cos\theta$ and the average resistance component current Izr can be improved by shortening the set sampling cycle.

Furthermore, as in the resistance component current $I_0 \cos\theta$, the average resistance component current Izr may include the component of a control voltage (e.g., a PWM-controlled component) by the band of an extraction frequency band set by the frequency component extraction unit 131 and may include only the frequency of a basic AC voltage waveform component other than the component of the control voltage.

[Method of Calculating Basic AC Voltage Ef and Respective Phase Ground Voltages Eu, Ev, and Ew]

Furthermore, the voltage value of each of the basic AC voltage Ef and the respective phase ground voltages Eu, Ev, and Ew forming pairs along with such a resistance component current $I_0 \cos\theta$ may be calculated by integrating a voltage value between the zero-crossings as in the resistance component current $I_0 \cos\theta$.

As shown in FIG. 9(a), since the respective phase ground voltages Eu, Ev, and Ew are measured in a specific period in a specific sampling period, the numerical data (measured values) of the basic AC voltage Ef and respective phase ground voltages Eu, Ev, and Ew extracted by the zero-crossing data extraction unit 134 is assumed to be n, for example, between the zero-crossings.

In order to calculate the voltage values of the basic AC voltage Ef and the respective phase ground voltages Eu, Ev, and Ew, the voltage value calculation unit 142 attaches a + or − sign to each of the 1 to n basic AC voltages Ef and respective phase ground voltages Eu, Ev, and Ew depending on a potential difference (e.g., ±) (in FIG. 9(a), a solid line arrow is + and a broken line arrow is −) and sequentially adds them.

Since an addition is equivalent to the integration of the basic AC voltage Ef and each of the respective phase ground voltages Eu, Ev, and Ew between the zero-crossings, each of the added voltage values becomes a total amount of a voltage supplied between the zero-crossings.

Furthermore, each of the respective phase ground voltages Eu, Ev, and Ew includes the voltage of a control voltage component (e.g., a PWM-controlled component) in addition to the basic AC voltage Ef.

This is realized by setting an extraction frequency band, set by the frequency component extraction unit 131, as a frequency band having a specific numerical range, such as the frequency ±α (e.g., +100 Hz, −20 Hz) of the basic AC voltage waveform.

[Method of Calculating Average Voltage of Basic AC Voltage Ef and Each of Respective Phase Ground Voltages Eu, Ev, and Ew]

Furthermore, as shown in FIG. 9(b), an average voltage of each of the basic AC voltage Ef and the respective phase ground voltages Eu, Ev, and Ew between the zero-crossings may be calculated.

The voltage value calculation unit 142 calculates the average voltage by dividing each of added voltage values (integral values between the zero-crossings) by n.

Furthermore, the sampling cycle of the respective phase ground voltages Eu, Ev, and Ew is made to be the same as that of the ground zero-phase current I. In this case, the sampling cycle of the respective phase ground voltages Eu, Ev, and Ew may be set in a specific cycle, and the accuracy of the sum voltage and average voltage of each of the basic AC voltage Ef and the respective phase ground voltages Eu, Ev, and Ew can be improved by shortening the set sampling cycle.

Furthermore, the average voltage of each of the basic AC voltage Ef and the respective phase ground voltages Eu, Ev, and Ew includes the voltage of a control voltage component (e.g., a PWM-controlled component) in addition to the basic AC voltage Ef.

The resistance value calculation unit 143 calculates a combined ground combined resistance value Z of the ground resistance components Ru, Rv, and Rw of the respective phases and each of the respective phase ground resistance values Ru, Rv, and Rw of the respective phases using an average resistance component current Izr calculated by the current value calculation unit 141 and the average voltage of each of the basic AC voltage Ef and the respective phase ground voltages Eu, Ev, and Ew calculated by the voltage value calculation unit 142.

The method of calculating a ground combined resistance value Z includes a first calculation method of calculating the ground combined resistance value Z using an average voltage of basic AC voltages Ef and an average resistance component current Izr and a second calculation method of calculating a ground combined resistance value Z using an average voltage of each of respective phase ground voltages Eu, Ev, and Ew and an average resistance component current Izr.

[First Calculation Method of Ground Combined Resistance Value]

A ground combined resistance value Z obtained by combining the ground resistance components Ru, Rv, and Rw of the respective phases may be calculated by dividing an average voltage of basic AC voltages Ef by an average resistance component current Izr as shown in Equation 4 in accordance with Ohm's Law.

[Equation 4]

$$Z = \frac{Ef}{Izr} \qquad \text{(Equation 4)}$$

In this case, the average voltage of the basic AC voltages Ef is an average value of the basic AC voltages Ef including only the frequency of a basic AC voltage waveform component other than the frequency component of a control voltage. Accordingly, if the component of a control voltage is included in the average resistance component current Izr, the precision of a calculated ground combined resistance value Z is reduced. Accordingly, the frequency component extraction unit 131 adopts the average resistance component current Izr, including only the frequency of a basic AC voltage waveform component other than the frequency component of a control voltage, as the average resistance component current Izr which is used to calculate the ground combined resistance value Z.

Furthermore, in a plurality of zero-crossings having different periods, the precision of a calculated ground combined resistance value Z can be improved by substituting each of an average voltage of basic AC voltages Ef and an average resistance component current Izr in Equation 4 while calculating a plurality of the average voltages of the basic AC voltages Ef and the average resistance component currents.

[Second Calculation Method of Ground Combined Resistance Value]

In the second calculation method, the ground combined resistance value Z is calculated using an average voltage of each of the respective phase ground voltages Eu, Ev, and Ew instead of the basic AC voltage Ef.

A ground combined resistance value Z obtained by combining the ground resistance components Ru, Rv, and Rw of the respective phases may be calculated by dividing an average value (the average value is calculated as $\lceil 3 \rfloor$ in Equation 5) of the average voltages of respective phase ground voltages Eu, Ev, and Ew by an average resistance component current Izr as shown in Equation 5 in accordance with Ohm's Law.

[Equation 5]

$$Z = \frac{Eu + Ev + Ew}{3 \times Izr} \qquad \text{(Equation 5)}$$

In this case, since each of the average voltages of the respective phase ground voltages Eu, Ev, and Ew includes the frequency component of a control voltage, the extracted average resistance component current Izr of a frequency component having the same band as the average voltages Eu, Ev, and Ew is adopted as an average resistance component current Izr which is used to calculate the ground combined resistance value Z.

Furthermore, the precision of a calculated ground combined resistance value Z can be improved by substituting each of the average voltages of respective phase ground voltages Eu, Ev, and Ew between a plurality of zero-crossings having different periods and an average resistance component current Izr in Equation 5 while calculating a plurality of the average voltages of the respective phase ground voltages Eu, Ev, and Ew and the average resistance component currents Izr.

[Method of Calculating Respective Phase Ground Resistance Values]

The resistance value calculation unit 143 calculates the respective phase ground resistance values of the ground resistance components Ru, Rv, and Rw of the respective phases as below.

Pieces of respective phase ground resistance Ru, RV, and Rw that are connected in parallel, an average voltage of each of respective phase ground voltages Eu, Ev, and Ew, and an average resistance component current Izr satisfy a relationship of Equation 6.

[Equation 6]

$$Izr = \frac{Eu}{Ru} + \frac{Ev}{Rv} + \frac{Ew}{Rw} \qquad \text{(Equation 6)}$$

Such a relationship is also established with respect to the average voltages of the respective phase ground voltages Eu, Ev, and Ew between a plurality of zero-crossings having different periods and the average resistance component current Izr corresponding to each of the average voltages of the respective phase ground voltages Eu, Ev, and Ew. Accordingly, the resistance value calculation unit 143 calculates a combination of the pieces of respective phase ground resistance Ru, RV, and Rw in which the right side and the left side become the same through repetition operation by substituting the average voltages and the average resistance component current Izr in Equation 6.

That is, the resistance value calculation unit 143 calculates a combination of the pieces of respective phase ground resistance Ru, RV, and Rw through multiple regression analysis using the average voltages of the respective phase ground voltages Eu, Ev, and Ew as independent variables (description variables), the average resistance component current Izr as a dependent variable, and Equation 6 as a regression equation.

Specifically, if the average voltages of the respective phase ground voltages Eu, Ev, and Ew are respectively indicated by Eu, Ev, and Ew, pieces of respective phase ground resistance Ru ($Ru_0$, $Ru_1$, $Ru_2$ ... ), Rv ($Rv_0$, $Rv_1$, $Rv_2$ ... ), and Rw ($Rw_0$, $Rw_1$, $Rw_2$ ... ) are made to approach true values by sequentially updating the pieces of respective phase ground resistance Ru, Rv, and Rw corresponding to average voltages Eu ($Eu_0$, $Eu_1$, $Eu_2$ ... ), Ev ($Ev_0$, $Ev_1$, $Ev_2$ ... ), and Ew ($Ew_0$, $Ew_1$, $Ew_2$ ... ) between a plurality of zero-crossings having different periods and an average resistance component current Izr ($Izr_0$, $Izr_1$, $Izr_2$ ... ) forming pairs along with the average voltages while estimating the pieces of respective phase ground resistance Ru, Rv, and Rw and the average resistance component current Izr using the average voltages Eu, Ev, and Ew and the average resistance component current Izr.

Specifically, pieces of respective phase ground resistance $Ru_0$, $Rv_0$, and $Rw_0$ are indicative of respective initial values. The pieces of respective phase ground resistance Ru, RV, and Rw are made to approach true values by sequentially updating the values of the pieces of respective phase ground resistance $Ru_0$, $Rv_0$, and $Rw_0$, like pieces of first respective phase ground resistance $Ru_1$, $Rv_1$, and $Rw_1$ and pieces of second respective phase ground resistance $Ru_2$, $Rv_2$, and $Rw_2$, using the initial values of a specific line form.

Furthermore, predetermined specific values are used as the initial values $Ru_0$, $Rv_0$, and $Rw_0$.

In the repetition operation, as shown in Equation 7, the values of the pieces of respective phase ground resistance Ru, RV, and Rw when a difference S between the right side and left side of Equation 6 becomes zero are true values.

[Equation 7]

$$S = Izr - \left(\frac{Eu}{Ru} + \frac{Ev}{Rv} + \frac{Ew}{Rw}\right) = 0 \quad \text{(Equation 7)}$$

In this case, although the values of the pieces of respective phase ground resistance Ru, RV, and Rw do not become zero, the values of the pieces of respective phase ground resistance Ru, RV, and Rw may be determined to have approached (converged on) true values because they become specific values X close to zero, as shown in Equation 8.

[Equation 8]

$$S = \left|Izr - \left(\frac{Eu}{Ru} + \frac{Ev}{Rv} + \frac{Ew}{Rw}\right)\right| \leq X \quad \text{(Equation 8)}$$

In detailed repetition operation, for example, first, the difference S is calculated by substituting the respective phase average voltages $Eu_0$, $Ev_0$, and $Ew_0$, the average resistance component current $Izr_0$ forming pairs along with the respective phase average voltages $Eu_0$, $Ev_0$, and $Ew_0$, and the initial values $Ru_0$, $Rv_0$, and $Rw_0$ of the pieces of respective phase ground resistance in Equation 8. In the process of calculating the difference S, a second term (a value in parentheses) on the right side of Equation 8 becomes a first leakage current value.

If the difference S is zero (0) or a specific number X or less, the initial values $Ru_0$, $Rv_0$, and $Rw_0$ becomes the true values of the pieces of respective phase ground resistance Ru, RV, and Rw.

If the difference S is not zero (0) or a specific number X or less, the initial values $Ru_0$, $Rv_0$, and $Rw_0$ are updated with the pieces of first respective phase ground resistance $Ru_1$, $Rv_1$, and $Rw_1$.

Furthermore, a new difference S is calculated by substituting the respective phase average voltages $Eu_1$, $Ev_1$, and $Ew_1$ that are different between zero-crossings, an average resistance component current $Izr_1$ forming pairs along with the respective phase average voltages $Eu_1$, $Ev_1$, and $Ew_1$, and the pieces of first respective phase ground resistance $Ru_1$, $Rv_1$, and $Rw_1$ in Equation 8. In the process of calculating the difference S, a second term on the right side of Equation 8 becomes a second leakage current value.

If the difference S is zero (0) or a specific number X or less, pieces of respective phase ground resistance $Ru_1$, $Rv_1$, and $Rw_1$ become the true values of pieces of respective phase ground resistance Ru, RV, and Rw. Meanwhile, if the difference S is not zero (0) or a specific number X or less, pieces of first respective phase ground resistance $Ru_1$, $Rv_1$, and $Rw_1$ are updated with pieces of second respective phase ground resistance $Ru_2$, $Rv_2$, and $Rw_2$. Such an update is repeated until the difference S becomes zero (0) or a specific number X or less.

In the process of such repetition operation, the update of the pieces of respective phase ground resistance Ru, RV, and Rw is executed according to the following update method.

For example, one of two methods below may be adopted as the method of updating the pieces of respective phase ground resistance Ru, RV, and Rw.

The first update method is a method of determining that an average voltage that belongs to average voltages Eu, Ev, and Ew and that has a maximum value is a factor generating a difference S, updating only one of pieces of respective phase ground resistance Ru, RV, and Rw corresponding to the average voltage having a maximum value, and not updating the remaining pieces of respective phase ground resistance. A linear equation, such as that shown in Equation 9, for example, may be used in the update.

[Equation 9]

$$Ru_{n+1}, Rv_{n+1}, Rw_{n+1} = Ru_n, Rv_n, Rw_n + S \times k \quad \text{(Equation 9)}$$

In this case, one of the pieces of respective phase ground resistance Ru, RV, and Rw is updated in Equation 9. N denotes an integer of zero (0) or more, and k is a specific correction coefficient.

Accordingly, the value of any one of the pieces of respective phase ground resistance Ru, RV, and Rw which is most different from a true value may be made to rapidly approach the true value.

Furthermore, the second update method is a method of updating pieces of respective phase ground resistance Ru, RV, and Rw based on the values of average voltages Eu, Ev, and Ew, respectively. A linear equation, such as that shown in Equation 10, for example, may be used.

[Equation 10]

$$Ru_{n+1}, Rv_{n+1}, Rw_{n+1} = Ru_n, Rv_n, Rw_n + Sx(Eu_n, Ev_n, Ew_n) \times k \quad \text{(Equation 10)}$$

In this case, in Equation 10, all of the pieces of respective phase ground resistance Ru, Rv, and Rw are updated. N denotes an integer of zero (0) or more, and k is a specific correction coefficient.

Accordingly, the value of each of the pieces of respective phase ground resistance Ru, RV, and Rw may be made to approach a true value based on the value of each of the average voltages Eu, Ev, and Ew.

In executing the repetition operation as described above, the initial values $Ru_0$, $Rv_0$, and $Rw_0$ of the pieces of respective phase ground resistance Ru, RV, and Rw need to be previously determined.

In order to increase calculation speed of the pieces of respective phase ground resistance Ru, RV, and Rw, it is preferred that the initial values $Ru_0$, $Rv_0$, and $Rw_0$ are close to a true value as far as possible. Accordingly, the initial values $Ru_0$, $Rv_0$, and $Rw_0$ are calculated from the aforementioned ground combined resistance value Z.

An average value Ra of the pieces of respective phase ground resistance Ru, RV, and Rw is used as the initial values $Ru_0$, $Rv_0$, and $Rw_0$ because the average value Ra is able to be calculated from the ground combined resistance value Z although the resistance values of the pieces of respective phase ground resistance Ru, RV, and Rw are unable to be calculated from the ground combined resistance value Z. In Equation 11 below, if each of the pieces of respective phase ground resistance Ru, RV, and Rw is substituted with the average value Ra.

[Equation 11]

$$Z = \left(\frac{1}{Ru} + \frac{1}{Rv} + \frac{1}{Rw} + \right)^{-1} = \left(\frac{3}{Ra}\right)^{-1} \quad \text{(Equation 11)}$$

The average value Ra may be represented as in Equation 12 based on Equation 11 and Equation 5.

[Equation 12]

$$Ra = 3 \times Z = \frac{Eu + Ev + Ew}{Izr} \quad \text{(Equation 12)}$$

That is, in the present embodiment, the average value Ra of the pieces of respective phase ground resistance Ru, RV, and Rw calculated from the ground combined resistance value Z may make fast speed that the pieces of respective phase ground resistance Ru, RV, and Rw approach a true value, that is, convergence according to repetition operation, using the average value Ra as each of the initial values $Ru_0$, $Rv_0$, and $Rw_0$ in Equation 7 or Equation 8.

In particular, the average value Ra that becomes the initial values $Ru_0$, $Rv_0$, and $Rw_0$ is not calculated from average voltages Eu, Ev, and Ew in a single zero-crossing and a single average resistance component current Izr corresponding to the average voltages Eu, Ev, and Ew, but the average value Ra that becomes the initial values $Ru_0$, $Rv_0$, and $Rw_0$ is calculated from average voltages Eu, Ev, and Ew between a plurality of zero-crossings having different periods and an average resistance component current Izr corresponding to the average voltages Eu, Ev, and Ew, thereby being capable of further making fast convergence.

Pieces of accurate respective phase ground resistance Ru, RV, and Rw may be calculated by executing repetition operation for making approach the pieces of respective phase ground resistance Ru, RV, and Rw to a true value in such a manner that the pieces of respective phase ground resistance Ru, RV, and Rw are updated while sequentially estimating the pieces of respective phase ground resistance Ru, RV, and Rw using average voltages Eu, Ev, and Ew between a plurality of zero-crossings having different periods and an average resistance component current Izr corresponding to the average voltages Eu, Ev, and Ew as described above.

Such operations as the respective phase resistance value calculation means and combined resistance value calculation means of the resistance value calculation unit 143 are executed based on the following flowchart.

Figure 10:
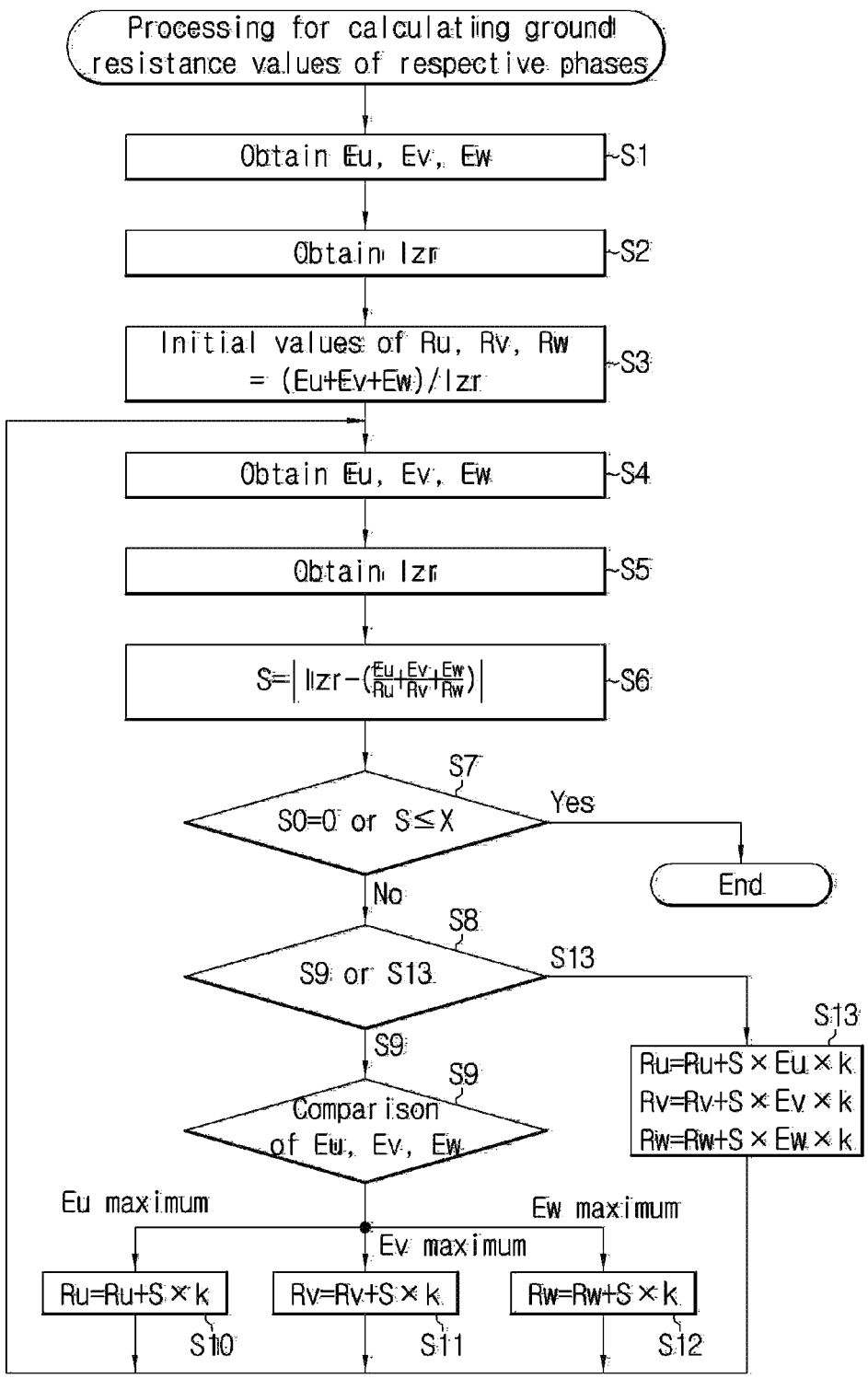
FIG. 10 is a flowchart illustrating processing for calculating the ground resistance values of the respective phases regarding a first embodiment of the present invention.
Figure 11:
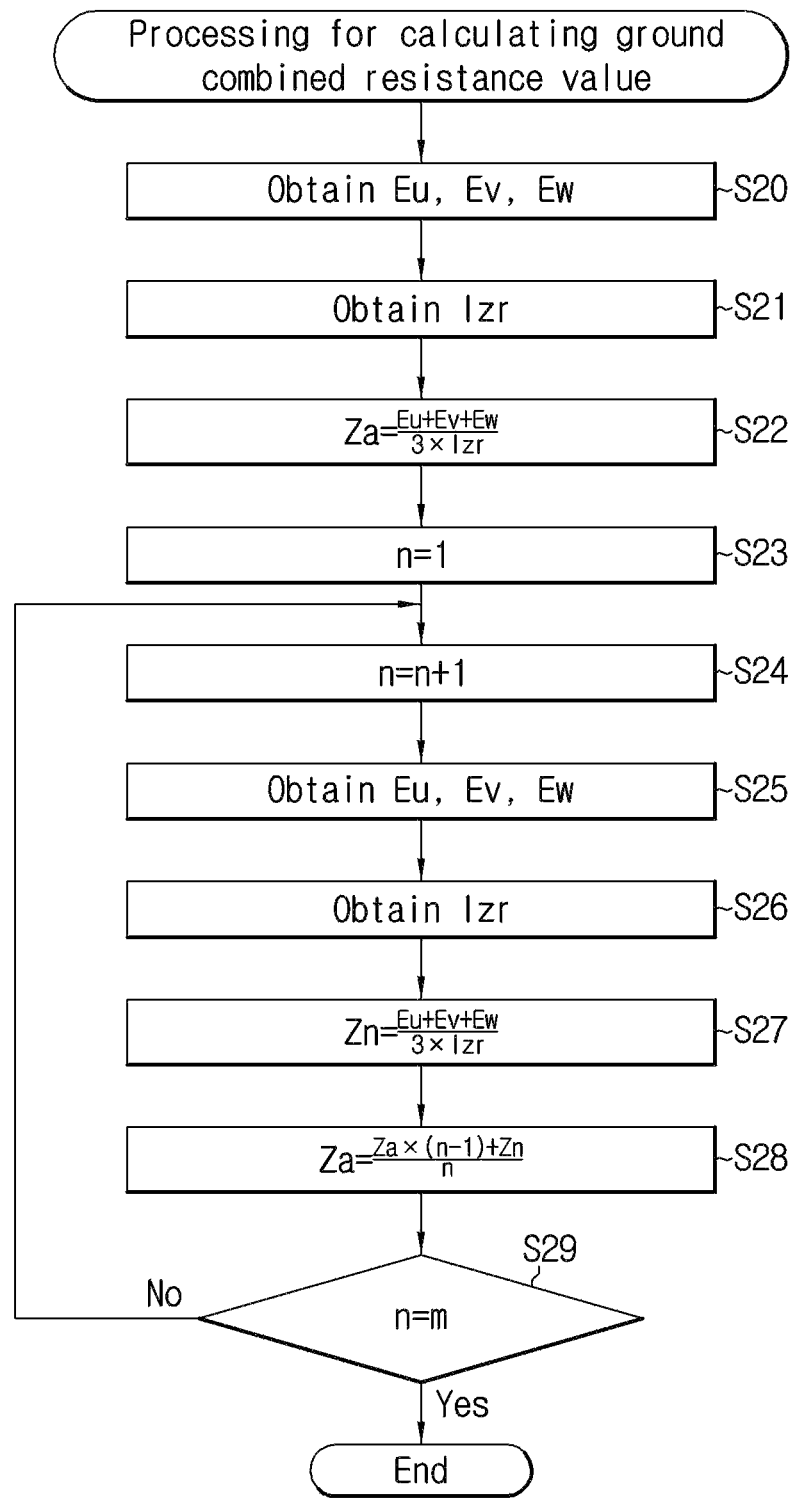
FIG. 11 is a flowchart illustrating processing for calculating a ground combined resistance value regarding a first embodiment of the present invention.

For example, the respective phase ground resistance values of the respective ground resistance components Ru, Rv, and Rw are calculated based on is a flowchart regarding processing for calculating the respective phase ground resistance values which is shown in FIG. 10. The ground combined resistance value Z of the ground resistance components Ru, Rv, and Rw is calculated based on a flowchart regarding processing for calculating the ground combined resistance value which is shown in FIG. 11.

In the processing for calculating the respective phase ground resistance values shown in FIG. 10, first, in S1~S3, the initial values of pieces of respective phase ground resistance Ru, RV, and Rw are calculated.

Specifically, average voltages Eu, Ev, and Ew and an average resistance component current Izr forming pairs along with the average voltages Eu, Ev, and Ew are obtained from measurement data between zero-crossings (S1, S2). Average values Ra that become the initial value of the pieces of respective phase ground resistance Ru, RV, and Rw are calculated by substituting the average voltages Eu, Ev, and Ew and an average resistance component current Izr in Equation 12 (S3).

In this case, regarding average voltages and an average resistance component current that become acquisition sources, an average value Ra obtained by calculating the average value of each of a plurality of groups of measurement data, including average voltages Eu, Ev, and Ew between zero-crossings having different periods and the average resistance component current Izr forming pairs along with the average voltages Eu, Ev, and Ew, in addition to measurement data that is first measured and substituting the calculated average values in Equation 12 may be used as the initial value.

Next, processing for making the pieces of respective phase ground resistance components Ru, Rv, and Rw approach a true value is executed based on the average voltages Eu, Ev, and Ew and the average resistance component current Izr forming pairs along with the average voltages Eu, Ev, and Ew in S4~S13.

First, the average voltages Eu, Ev, and Ew and the average resistance component current Izr forming pairs along with the average voltages Eu, Ev, and Ew are obtained (S4, S5), and a difference S is calculated by substituting the average voltages Eu, Ev, and Ew and the average resistance component current Izr in Equation 8 (S6).

Next, whether the difference S is zero (0) or a specific number X or less is determined (S7).

If the difference S is zero (0) or the specific number X or less (S7—Yes), the processing is terminated.

Meanwhile, if the difference S is not zero (0) or the specific number X or less (S7—No), processing regarding any one predetermined step of S9 and S13 is executed (S8).

The process of S9~S12 is a method, that is, the first update method of updating only one of pieces of respective phase ground resistance Ru, RV, and Rw corresponding to an average voltage that belongs to the average voltages Eu, Ev, and Ew and that is indicative of a maximum value and not updating pieces of the remaining respective phase ground resistance.

Specifically, a comparison is performed on the values of the average voltages Eu, Ev, and Ew (S9), and ground resistance corresponding to an average voltage having a maximum value is updated based on Equation 9.

For example, only the ground resistance is updated if the average voltage Eu is a maximum (S10), only the ground resistance Rv is updated if the average voltage Ev is a maximum (S11), and only the ground resistance Rw is updated if the average voltage Ew is a maximum (S12).

Thereafter, the processing returns to S4, and S4~S12 are repeated until the difference S becomes zero (0) or the specific number X or less.

Meanwhile, the processing of S13 is the second update method of updating the pieces of respective phase ground resistance Ru, RV, and Rw based on the respective average voltages Eu, Ev, and Ew.

Specifically, each of the pieces of respective phase ground resistance Ru, RV, and Rw is updated based on Equation 10 (S13).

Thereafter, the processing returns to S4, and S4~S8 and S13 are repeated until the difference S becomes zero (0) or a specific number X.

Furthermore, when the difference S becomes zero (0) or the specific number X or less and corresponding processing is terminated (S7—Yes), the values of the pieces of respective phase ground resistance Ru, RV, and Rw at that time are displayed on the display unit 15.

Pieces of precise respective phase ground resistance Ru, RV, and Rw corresponding to average voltages Eu, Ev, and Ew between a plurality of zero-crossings having different periods and an average resistance component current Izr forming pairs along with the average voltages can be calculated because the pieces of respective phase ground resistance Ru, RV, and Rw can be made to approach a true value by updating the pieces of respective phase ground resistance Ru, RV, and Rw while sequentially estimating the pieces of respective phase ground resistance Ru, RV, and Rw using the average voltages Eu, Ev, and Ew and the average resistance component current Izr forming pairs along with the average voltages through such processing for calculating the respective phase ground resistance values.

The processing for calculating a ground combined resistance value shown in FIG. 11 is processing for calculating a ground average value of the combined resistance values Za using average voltages Eu, Ev, and Ew between a plurality of zero-crossings having different periods and an average resistance component current Izr forming pairs along with the average voltages Eu, Ev, and Ew. In this processing, first, in S20~S23, initial setting, such as calculating the initial value of the average value Za, is executed.

Specifically, average voltages Eu, Ev, and Ew and an average resistance component current Izr forming pairs along with the average voltages Eu, Ev, and Ew are obtained (S20, S21). The initial value of a ground average value of the combined resistance values Za is calculated by substituting the average voltages Eu, Ev, and Ew and the average resistance component current Izr in Equation 5 (S22). In this case, measurement data that is first measured may be used as the average voltages and the average resistance component current that become acquisition sources. Furthermore, an initial value 1 is set in a repetition calculation number n (S23).

Next, in S24~S29, processing for updating a ground average value of a combined resistance values Za is executed based on obtained average voltages Eu, Ev, and Ew and an average resistance component current Izr forming pairs along with the obtained average voltages Eu, Ev, and Ew.

First, at the same time as the repetition calculation number n is updated with +1 (S24), average voltages Eu, Ev, and Ew and an average resistance component current Izr forming pairs along with the average voltages Eu, Ev, and Ew are obtained (S25, S26). A (this time) ground combined resistance value Zn is calculated by substituting the average voltages Eu, Ev, and Ew and the average resistance component current Izr in Equation 5 (S27).

Next, the sum (Za×(n−1)) of (previous time) average values Za (including an initial value) of the ground combined resistance value and the calculated ground combined resistance value Zn are added. A ground average value of new combined resistance values Za is calculated by dividing the addition value by n (S28). Next, whether a repetition calculation number n has reached a maximum calculation number M is determined (S29). If the repetition calculation number n has reached M times, the processing is terminated (S29—Yes). If the repetition calculation number n has not reached M times (S29—No), S24~S28 are executed again.

Furthermore, if the repetition calculation number n has reached M times and thus corresponding processing has been terminated (S29—Yes), a ground average value of combined resistance values Za at that time is displayed on the display unit 15.

As described above, in processing for calculating a ground combined resistance value, a ground combined resistance value Z is calculated by repetition operation using average voltages Eu, Ev, and Ew between a plurality of zero-crossings having different periods and an average resistance component current Izr forming pairs along with the average voltages Eu, Ev, and Ew. Accordingly, the precision of a ground combined resistance value can be improved.

Furthermore, a value obtained by dividing the ground combined resistance value Z calculated as described above by ⌈3⌋ may be used as the initial value of pieces of respective phase ground resistance Ru, RV, and Rw in the processing for calculating respective phase ground resistance values.

As described above, in accordance with the leakage current calculation device and the method of calculating a leakage current according to the present embodiment, an accurate leakage current value on which the influence of noise has been suppressed can be calculated by integral calculus because the value of a leakage current flowing through the ground resistance component of a ground leakage current other than the ground capacitance component of the three-phase motor.

Furthermore, an accurate resistance value on which the influence of noise has been suppressed can be calculated because at the same time as respective phase ground voltages are calculated by integral calculus in addition to a leakage current value, a ground combined resistance value and respective phase ground resistance values are calculated based on the leakage current value and respective phase ground voltages calculated as described above.

The preferred embodiments of the leakage current calculation device and the method of calculating a leakage current according to the present invention have been described above, but the leakage current calculation device and the method of calculating a leakage current regarding the present invention are not limited to the aforementioned embodiments and may be modified in various ways without departing from the scope of the present invention.

For example, in the present embodiment, in calculating the ground combined resistance value Z obtained by combing the ground resistance components Ru, Rv, and Rw of the respective phases and the respective phase ground resistance values of the respective phases, the average resistance component current Izr, the basic AC voltage Ef, and average voltages of the respective phase ground voltages Eu, Ev, and Ew have been used, but the ground combined resistance value Z and the respective phase ground resistance values may be calculated using respective integral values.

Furthermore, a specific period in which the respective phase ground voltages Eu, Ev, and Ew and the ground zero-phase current I are measured may be a period in which one or more zero-crossings are specified.

Furthermore, a method of integrating the ground zero-phase current I, the basic AC voltage Ef, and the respective phase ground voltages Eu, Ev, and Ew between zero-crossings is not limited to the present embodiment. For example, an integral value may be output using an A-D converter for converting an analog signal into a digital signal by ΔΣ modulation.

INDUSTRIAL APPLICABILITY

The present invention may be widely used in a the leakage current calculation device for measuring leakage currents flowing through the resistance components of the respective phases of a three-phase motor, such as a servo motor, and the resistance value of each phase.

DESCRIPTION OF REFERENCE NUMERAL

10 leakage current calculation device
11 respective phase voltage measurement cable
12 zero-phase current transformer (ZCT)
13 signal processing unit
131 frequency component extraction unit 132 basic AC waveform extraction unit
133, 134 zero-crossing data extraction unit
14 operation unit 141 current value calculation unit
142 voltage value calculation unit
143 resistance value calculation unit
15 display unit

What is claimed is:

1. A leakage current calculation device, comprising:
ground voltage measurement means for measuring ground voltages respectively inputted to phases of a three-phase motor driven by an inverter device using a specific AC power supply as a power supply in a specific period,
zero-phase current measurement means for measuring a zero-phase current which is a ground leakage current flowing through the three-phase motor in a specific period,
basic AC waveform extraction means for extracting a basic AC voltage waveform having a frequency having a phase identical with a phase of the ground voltage of each phase from the ground voltage,
frequency component extraction means for extracting a zero-phase current component of a frequency band comprising at least the frequency of the basic AC voltage waveform from the frequency band, and
leakage current value calculation means for calculating a leakage current value flowing through a ground resistance component of the ground leakage current other than a ground capacitance component of the three-phase motor by integrating the zero-phase current component of the frequency band in a period corresponding between zero crossings of the basic AC voltage waveform,
wherein the basic AC waveform extraction means extracts the basic AC voltage waveform by dividing a sum of the ground voltages inputted to the respective phases by 3.

2. The leakage current calculation device of claim 1, wherein:
the frequency band is set to have a specific numerical range,
the frequency component extraction means extracts the ground voltage component of the frequency band of each of the phases of the three-phase motor, and
the leakage current calculation device comprises:
respective phase voltage value calculation means for calculating voltage values of the respective phases by integrating the ground voltage components of the respective phases in a period corresponding between the zero crossings of the basic AC voltage waveform, and
respective phase resistance value calculation means for calculating resistance values of the respective phases which become the ground resistance components of the respective phases of the three-phase motor from the voltage values and leakage current values of the respective phases.

3. The leakage current calculation device of claim 2, wherein the respective phase resistance value calculation means calculates the resistance values of the respective phases by specific repetition operation from the leakage current values and voltage values of the respective phases in a period corresponding between a plurality of zero-crossings having a different periods.

4. The leakage current calculation device of claim 3, wherein the respective phase resistance value calculation means executes the repetition operation for:
calculating a first leakage current value from a pair of the leakage current values and each of the voltage values of the respective phases and an initial resistance value of each phase which becomes a predetermined initial value of the resistance value of each phase,
calculating a first difference between the first leakage current value and the pair of leakage current values,
calculating a first resistance value of each phase by updating the initial resistance value of each phase based on the first difference,
calculating a second leakage current value from the leakage current values forming another pair and each of the voltage values of the respective phases and the first resistance value of each phase,
calculating a second difference between the second leakage current value and the leakage current values forming another pair,
calculating a second resistance value of each phase by updating the first resistance value of each phase based on the second difference, and
updating the resistance value of each phase until the first difference, the second difference, or a difference subsequent to the first and second differences becomes zero or a specific value or less.

5. The leakage current calculation device of claim 3, further comprising:
combined resistance value calculation means for calculating a combined resistance value obtained by combining the ground resistance components of the respective phases of the three-phase motor from an average value of the voltage values of the respective phases and the leakage current value,
wherein the combined resistance value calculation means calculates the average value of the combined resistance values from the leakage current values forming a pair and each of the voltage values of the respective phases in a period corresponding between a plurality of the zero-crossings having different periods.

6. The leakage current calculation device of claim 3, wherein:
the frequency band is approximately set to be identical with the frequency of the basic AC voltage waveform, and
the leakage current calculation device comprises:
basic AC voltage value calculation means for calculating the basic AC voltage value by integrating a corresponding basic AC voltage waveform in a period corresponding between zero crossings of the basic AC voltage waveform, and
combined resistance value calculation means for calculating the combined resistance value from the basic AC voltage value and the leakage current value.

7. The leakage current calculation device of claim 4, further comprising:
combined resistance value calculation means for calculating a combined resistance value obtained by combining the ground resistance components of the respective phases of the three-phase motor from an average value of the voltage values of the respective phases and the leakage current value,
wherein the combined resistance value calculation means calculates the average value of the combined resistance values from the leakage current values forming a pair and each of the voltage values of the respective phases in a period corresponding between a plurality of the zero-crossings having different periods.

8. The leakage current calculation device of claim 4, wherein:
the frequency band is approximately set to be identical with the frequency of the basic AC voltage waveform, and
the leakage current calculation device comprises:
basic AC voltage value calculation means for calculating the basic AC voltage value by integrating a corresponding basic AC voltage waveform in a period corresponding between zero crossings of the basic AC voltage waveform, and
combined resistance value calculation means for calculating the combined resistance value from the basic AC voltage value and the leakage current value.

9. The leakage current calculation device of claim 2, further comprising:
combined resistance value calculation means for calculating a combined resistance value obtained by combining the ground resistance components of the respective phases of the three-phase motor from an average value of the voltage values of the respective phases and the leakage current value,
wherein the combined resistance value calculation means calculates the average value of the combined resistance values from the leakage current values forming a pair and each of the voltage values of the respective phases in a period corresponding between a plurality of the zero-crossings having different periods.

10. The leakage current calculation device of claim 2, wherein:
the frequency band is approximately set to be identical with the frequency of the basic AC voltage waveform, and
the leakage current calculation device comprises:
basic AC voltage value calculation means for calculating the basic AC voltage value by integrating a corresponding basic AC voltage waveform in a period corresponding between zero crossings of the basic AC voltage waveform, and
combined resistance value calculation means for calculating the combined resistance value from the basic AC voltage value and the leakage current value.

11. The leakage current calculation device of claim 1, wherein:
the frequency band is approximately set to be identical with the frequency of the basic AC voltage waveform, and
the leakage current calculation device comprises:
basic AC voltage value calculation means for calculating the basic AC voltage value by integrating a corresponding basic AC voltage waveform in a period corresponding between zero crossings of the basic AC voltage waveform, and
combined resistance value calculation means for calculating the combined resistance value from the basic AC voltage value and the leakage current value.

12. A method of calculating a leakage current, comprising: measuring ground voltages respectively inputted to phases of a three-phase motor driven by an inverter device using a specific AC power supply as a power supply in a specific period, measuring a zero-phase current which is a ground leakage current flowing through the three-phase motor in a specific period, extracting a basic AC voltage waveform having a frequency having a phase identical with a phase of the ground voltage of each phase from the ground voltage, extracting a zero-phase current component of a frequency band comprising at least the frequency of the basic AC voltage waveform from the frequency band, and calculating a leakage current value flowing through a ground resistance component of the ground leakage current other than a ground capacitance component of the three-phase motor by integrating the zero-phase current component in a period corresponding between zero crossings of the basic AC voltage waveform, wherein said extracting the basic AC waveform comprises extracting the basic AC voltage waveform by dividing a sum of the ground voltages inputted to the respective phases by 3.

* * * * *